United States Patent
Kim

(10) Patent No.: US 7,400,542 B2
(45) Date of Patent: Jul. 15, 2008

(54) CONTROL SELECTION CIRCUIT AND METHOD FOR A SEMICONDUCTOR DEVICE

(75) Inventor: Sin-Ho Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 277 days.

(21) Appl. No.: 11/279,371

(22) Filed: Apr. 11, 2006

(65) Prior Publication Data
US 2007/0081400 A1  Apr. 12, 2007

(30) Foreign Application Priority Data
Oct. 10, 2005  (KR) ............... 10-2005-0094917

(51) Int. Cl.
*G11C 7/00* (2006.01)
(52) U.S. Cl. ............ 365/191; 365/189.11; 365/194
(58) Field of Classification Search ........ 365/191, 365/189.11, 194
See application file for complete search history.

(56) References Cited

U.S. PATENT DOCUMENTS 5,617,365 A * 4/1997 Horiguchi et al. ........ 365/200
6,532,177 B1 * 3/2003 Butler ................ 365/189.09
2004/0252577 A1  12/2004 Kwak et al.

FOREIGN PATENT DOCUMENTS

| JP | 2005-004591 | 1/2005 |
|----|-------------|--------|
| KR | 1999-0080723 | 11/1999 |
| KR | 2002-0082534 | 10/2002 |
| KR | 2004-0001434 | 1/2004 |

OTHER PUBLICATIONS

English language abstract of Korean Publication No. 1999-0080723.
English language abstract of Korean Publication No. 2002-0082534.
English language abstract of Korean Publication No. 2004-0001434.
English language abstract of Japanese Publication No. 2005-004591.

* cited by examiner

*Primary Examiner*—Pho M. Luu
(74) *Attorney, Agent, or Firm*—Marger Johnson & McCollom, P.C.

(57) ABSTRACT

A control selection circuit for a semiconductor device including a pulse generation circuit to delay a first pulse signal by a predetermined delay time to generate a second pulse signal, a frequency information generation circuit to generate a selection signal in response to the second pulse signal, the selection signal indicating an operating frequency of the semiconductor device, and a control circuit to select a control scheme of for the semiconductor device in response to the selection signal.

25 Claims, 4 Drawing Sheets

CONTROL SELECTION CIRCUIT AND METHOD FOR A SEMICONDUCTOR DEVICE

CROSS-REFERENCE TO RELATED PATENT APPLICATION

This application claims the benefit of Korean Patent Application No. 10-2005-0094917, filed on Oct. 10, 2005, in the Korean Intellectual Property Office, the disclosure of which is incorporated herein in its entirety by reference.

BACKGROUND OF THE INVENTION

1. Field of the Invention

This disclosure relates to a semiconductor device, and more particularly, to a control selection circuit and method which selects a control scheme of a control circuit for controlling a data input/output operation suitable for an operating frequency of a semiconductor device.

2. Description of the Related Art

A semiconductor device such as a semiconductor memory device operates using a control scheme suitable for an operating frequency of an externally applied system clock signal. Such a semiconductor memory device may be used for inputting/outputting data to/from a memory cell of a semiconductor memory device in a computer system. The data input/output speed of the semiconductor memory device is very important in determining the operation speed of the computer system.

FIG. 1 is a block diagram illustrating a semiconductor device 100. Referring to FIG. 1, the semiconductor device 100 includes a control selection circuit 110 and a control circuit 130. The semiconductor device 100 may be, for example, a semiconductor memory device such as a dynamic random access memory (DRAM).

The control circuit 130 controls the semiconductor device 100 to input/output data at a high frequency or a low frequency, in response to a selection signal SEL. The selection signal at SEL is an internal control signal. A reference frequency for generating the high frequency and the low frequency may be, for example, 500 MHz.

The control circuit 130 may include an output data sense amplifier. The output data sense amplifier may be a current sense amplifier. When the semiconductor device 100 operates at the high frequency, the output data sense amplifier of the control circuit 130 may always operate. Thus, a current consumption of the semiconductor device 100 may be large. However, when the semiconductor device 100 operates at the low frequency, the output data sense amplifier of the control circuit 130 may operate only in a valid time interval during which the data is output. As a result the current consumption of the semiconductor device 100 may be small.

The control selection circuit 110 outputs the selection signal SEL for selecting the control scheme of the control circuit 130. The control selection circuit 110 may include a fuse circuit which changes the state of the selection signal SEL depending on whether a fuse is cut or by a mode register set circuit which stores the data for controlling the operation mode of the semiconductor device 100.

Accordingly, the semiconductor device 100 uses only one control scheme in response to the selection signal SEL, and the selection signal SEL is activated in response to the state of the fuse or the state of the mode register, and a specific operating frequency.

SUMMARY OF THE INVENTION

An embodiment includes a control selection circuit for a semiconductor device including a pulse generation circuit to delay a first pulse signal by a predetermined delay time to generate a second pulse signal, a frequency information generation circuit to generate a selection signal in response to the second pulse signal, the selection signal indicating an operating frequency of the semiconductor device, and a control circuit to select a control scheme of for the semiconductor device in response to the selection signal.

An embodiment includes a control selection method for a semiconductor device including delaying a first pulse signal by a predetermined delay time to generate a second pulse signal, generating a selection signal in response to the second pulse signal, the selection signal indicating an operating frequency of the semiconductor device, and selecting a control scheme for a semiconductor device in response to the selection signal.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE INVENTION

Figure 1:
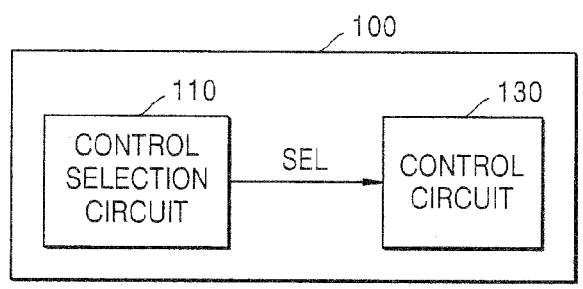
FIG. 1 is a black diagram schematically illustrating a semiconductor device 100.

Hereinafter, embodiments will be described in detail with reference to the attached drawings. Like reference numerals in the drawings denote like elements.

Figure 2:
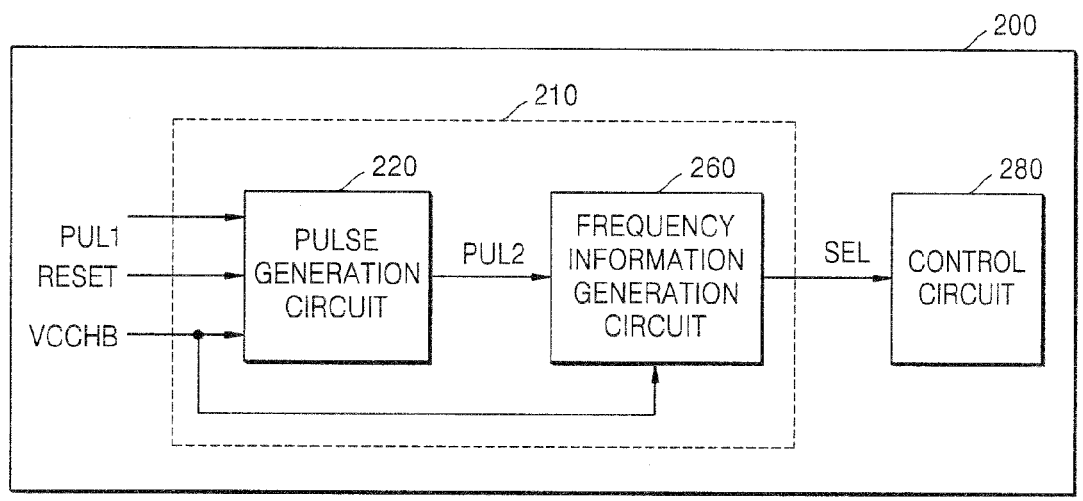
FIG. 2 is a block diagram illustrating a control selection circuit 210 of a semiconductor device 200 according to an embodiment.

FIG. 2 is a block diagram illustrating a control selection circuit 210 of a semiconductor device 200 according to an embodiment. Referring to FIG. 2, the semiconductor device 200 includes a control selection circuit 210 and a control circuit 280. The semiconductor device 200 may be, for example, a semiconductor memory device such as DRAM.

The control circuit 280 controls the semiconductor device 200 to input/output data at a high frequency or a low frequency in response to a selection signal SEL. The selector signal SEL is an internal control signal. The selection signal SEL includes operating frequency information of the semiconductor device 200. In other words, the selection signal SEL includes, information on whether the operating frequency is the high frequency or the low frequency. A reference frequency for determining the high frequency and the low frequency may be, for example, 500 MHz.

The control circuit 280 may include an output data sense amplifier. An example of an output data sense amplifier is a current sense amplifier. When the semiconductor device 200 operates at the high frequency, the output data sense amplifier of the control circuit 280 may operate continuously. Thus, a current consumption of the semiconductor device 200 may be large. However, if the semiconductor device 200 operates at the low frequency, the output data sense amplifier of the control circuit 280 may operate only in valid time interval during which the data is output. Thus, the current consumption of the semiconductor device 200 may be small.

The control selection circuit 210 outputs the selection signal SEL which selects a control scheme of the control circuit 280 for controlling a data input/output operation of the semiconductor device 200. The control selection circuit 210 includes a pulse generation circuit 220, and a frequency information generation circuit 260.

The pulse generation circuit 220 delays a first pulse signal PUL1 by a predetermined delay time to generate a second pulse signal PUL2. Furthermore, the pulse generation circuit 220 resets the second pulse signal PUL2 to a logic low level in response to a reset signal RESET or a power-up signal VCCHB.

The first pulse signal PUL1 is an operation instruction signal for activating the operation of the semiconductor device 200. The first pulse signal PUL1 may be substantially synchronized with a system clock signal input to the semiconductor device 200 and may have the same pulse width as that of the system clock signal. One of ordinary skill in the art will understand that the pulse width of the first pulse signal PUL1 may vary from the pulse width of the system clock signal depending on the method of synchronization, yet still be substantially the same. The reset signal RESET may be used when the operating frequency of the semiconductor device 200 is changed, and may be used as a signal for resetting a delay locked loop circuit (not shown) included in the semiconductor device 200. The power-up signal VCCHB is a signal which allows a power supply voltage to be applied to the semiconductor device 200.

The frequency information generation circuit 260 generates the selection signal SEL in response to the second pulse signal PUL2. Furthermore, the frequency information generation circuit 260 may reset the selection signal SEL to the logic low level in response to the power-up signal VCCHB.

Accordingly, the control selection circuit 210 of the semiconductor device 200 detects the operating frequency information of the semiconductor device 200, selects a control scheme (or signal scheme) for controlling a data input/output operation suitable for the detected operating frequency information, and provides the control scheme to the control circuit 280. In addition, since the control selection circuit 210 of the semiconductor circuit 200 can reset the second pulse signal PUL2 using the reset signal RESET, the control scheme can stably vary depending on the change of the operating frequency.

Figure 3:
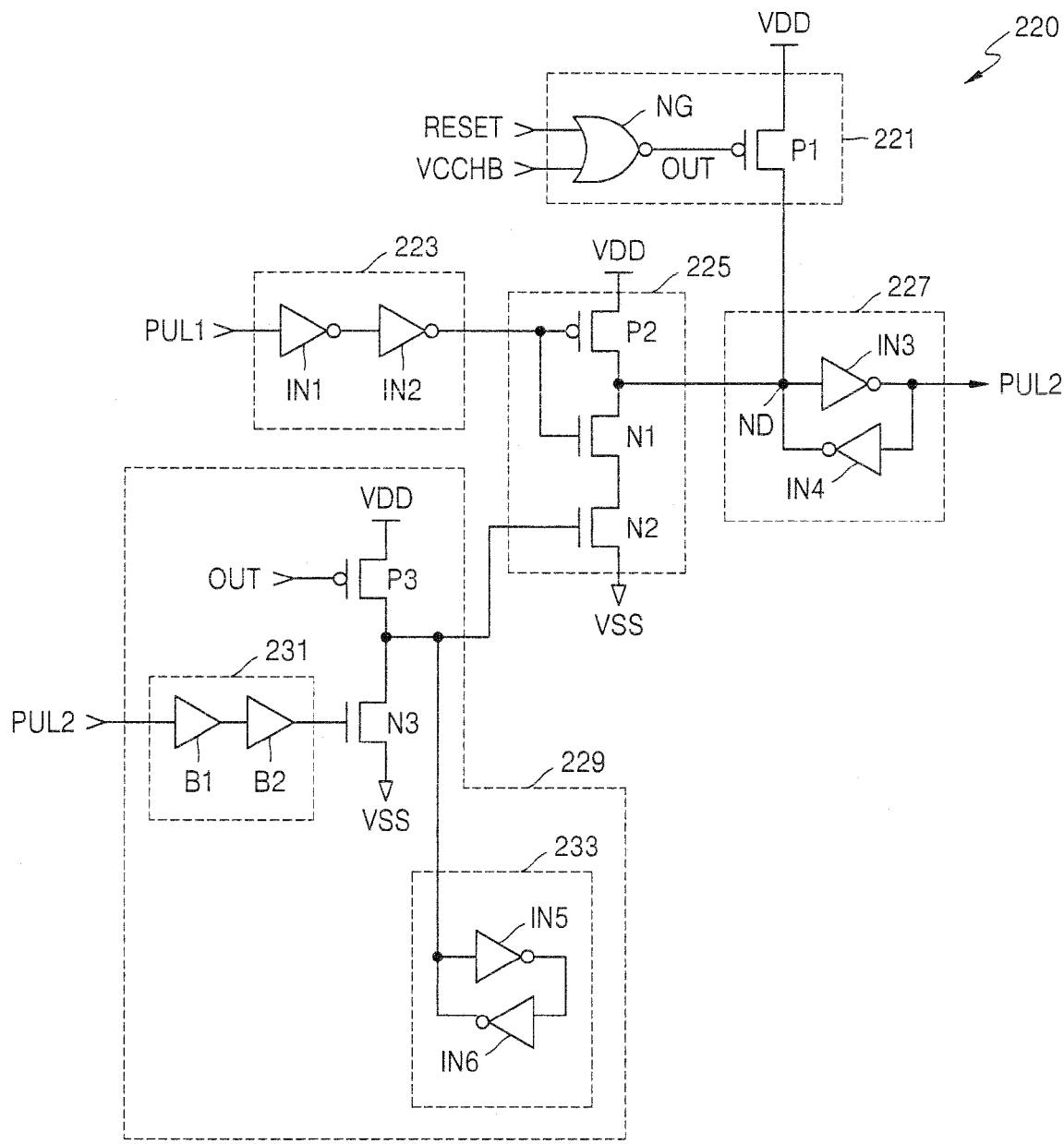
FIG. 3 is a circuit diagram illustrating a pulse generation circuit 220 of FIG. 2.

FIG. 3 is a circuit diagram illustrating the pulse generation circuit 220 of FIG. 2 in detail. Referring to FIG. 3, the pulse generation circuit 220 includes a reset unit 221, an input unit 223, an output unit 225, an output latch unit 227, and an output control unit 229.

The reset unit 221 includes a NOR gate NG for performing an inverted OR operation on the reset signal RESET and the power-up signal VCCHB, and a PMOS transistor P1 coupled to a power supply voltage VDD (for example, 1.8 Volts). The output signal OUT of the NOR gate NG is applied to the gate of the PMOS transistor P1. The reset unit 221 converts the state of a node ND into a logic high level and resets the second pulse signal PUL2 to the logic low level in response to the reset signal RESET or the power-up signal VCCHB.

The input unit 223 includes two inverters IN1 and IN2 which are coupled to each other in series. The input unit 223 delays the first pulse signal PUL1 by a predetermined delay time.

The output unit 225 includes a PMOS transistor P2 and NMOS transistors N1 and N2. The PMOS transistor P2 and the NMOS transistor N1 and N2 operate as an inverter. The PMOS transistor P2 is coupled to the power supply voltage VDD. The NMOS transistor N2 is coupled to a ground voltage VSS. The output unit 225 inverts the first pulse signal PUL1 delayed through the input unit 223 in response to the output signal of the output control unit 229.

The output latch unit 227 includes cross-coupled inverters IN3 and IN4. The output latch unit 227 inverts and latches the signal of the node ND, the output signal of the output unit 225, to generate the second pulse signal PUL2.

The output control unit 229 includes a delay unit 231, a PMOS transistor P3, an NMOS transistor N3, and a control latch unit 233. The delay unit 231 includes two buffers B1 and B2 which are coupled to each other in series. The control latch unit 233 includes cross-coupled inverters IN5 and IN6.

The output control unit 229 turns on the NMOS transistor N2 of the output unit 225 in response to the output signal OUT of the NOR gate NG, and turns off the NMOS transistor N2 of the output unit 225 in response to the second pulse signal PUL2. In other words, the output control unit 229 enables the output unit 225 when the output signal OUT of the NOR gate NG is in the logic low level and disables the output unit 225 when the second pulse signal PUL2 is activated to the logic high level. The control latch unit 233 latches the output signal of the output control unit 229.

Figure 4:
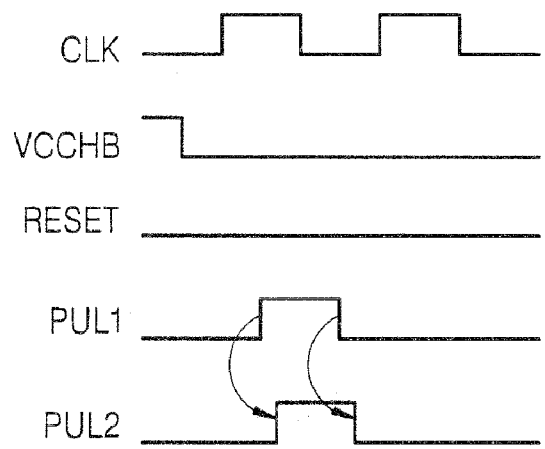
FIG. 4 is a timing diagram explaining the operation of the pulse generation circuit 220 of FIG. 3.

FIG. 4 is a timing diagram explaining the operation of the pulse generation circuit 220 of FIG. 3. Hereinafter, the operation of the pulse generation circuit 220 will be described with reference to FIG. 4.

When the reset signal RESET is in the logic low level, a deactivation state, and the power-up signal VCCHB is in the logic high level, the output signal of the NOR gate NG is the logic low level. As a result, the PMOS transistor P1 of the reset unit 221 is turned on, the node ND becomes the logic high level, and the second pulse signal PUL2 is reset to the logic low level. In addition, the PMOS transistor P3 of the output control unit 229 is turned on and the output signal of the output control unit 229 becomes the logic high level. Thus, the NMOS transistor N2 of the output unit 225 is turned on enabling the output unit 225.

If the power-up signal VCCHB becomes the logic low level, the output signal OUT of the NOR gate NG becomes the logic high level and the PMOS transistor P1 of the reset unit 221 is turned off. In addition, the PMOS transistor P3 of the output control unit 229 is turned off. The output signal of the output control unit 229 is held in the logic high level by the control latch unit 233 and the output unit 225 is held in an enable state.

The first pulse signal PUL1 is generated, having the logic high level during the pulse width of the system clock signal CLK. The first pulse signal PUL1 is delayed by the predetermined delay time to generate the second pulse signal PUL2.

The second pulse signal PUL2, having the logic high level, is delayed by a predetermined delay time through the delay unit 231 of the output control unit 229. The NMOS transistor N3 of the output control unit 229 is then turned on to disable the output unit 225. Afterwards, the second pulse signal PUL2 is held in the logic high level by the output latch unit 227.

If the operating frequency of the semiconductor device 200 illustrated in FIG. 2 is changed, the reset signal RESET becomes the logic high level, the second pulse signal PUL2 is reset to the logic low level, and the timing operation of the pulse generation circuit 220 illustrated in FIG. 4 corresponding to the changed operating frequency is performed again.

Figure 5:
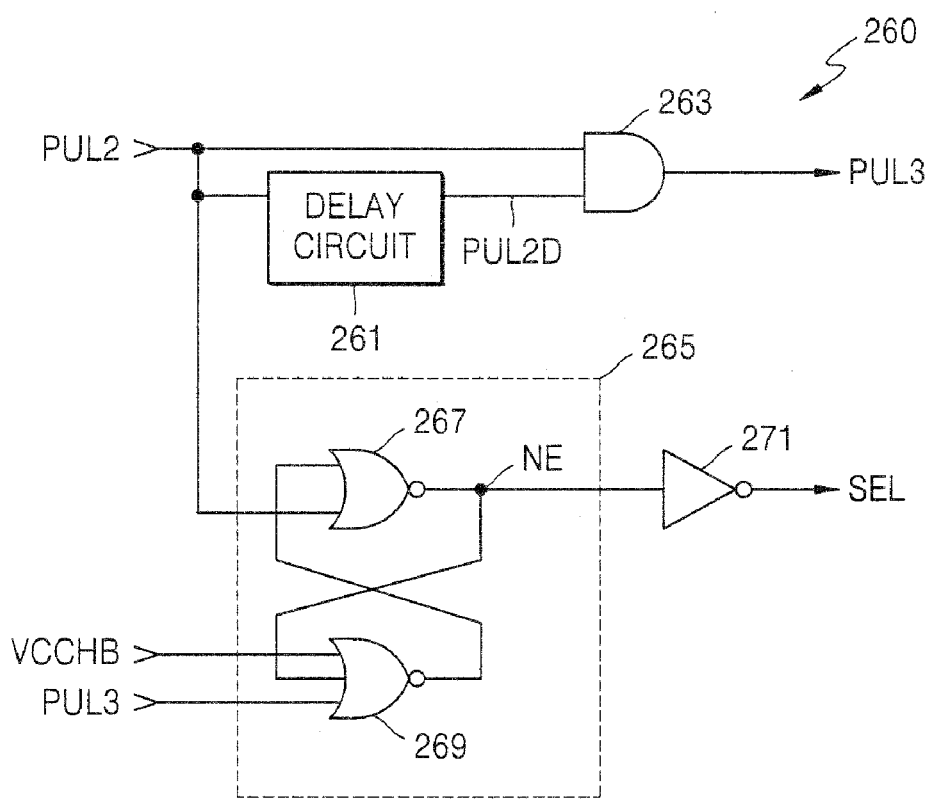
FIG. 5 is a circuit diagram illustrating a frequency information generation circuit 260 of FIG. 2.

FIG. 5 is a circuit diagram illustrating the frequency information generation circuit 260 of FIG. 2 in detail. Referring to FIG. 5, the frequency information generation circuit 260 includes a delay circuit 261, an AND gate 263, a latch circuit 265, and an inverter 271.

The delay circuit 261 includes an inverter chain. The delay circuit 261 delays the second pulse signal PUL2 by a predetermined time to generate a delayed second pulse signal PUL2D. The delay time of the second pulse signal PUL2 may be an integral multiple of a period of the system clock signal CLK.

The AND gate 263 performs a logical AND operation on the second pulse signal PUL2 and the delayed second pulse signal PUL2D to generate a third pulse signal PUL3. Since the logic level of the third pulse signal PUL3 is changed depending on the pulse width of the second pulse signal PUL2 and the delay time of the second pulse signal PUL2, the third pulse signal PUL3 may include the operating frequency information of the semiconductor device (200 of FIG. 2). In addition, since the delay time of the second pulse signal PUL2 is controlled by the delay circuit 261, it is possible to obtain various kinds of operating frequency information of the semiconductor device (200 of FIG. 2). Accordingly, although the selection signal SEL is used as the signal for selecting the control scheme of the control circuit 280, the third pulse signal PUL3 may be used as the signal for selecting the control scheme of the control circuit 280 of FIG. 2.

The latch circuit 265 includes NOR gates 267 and 269 as a NOR type SR latch. The output terminal NE of the latch circuit 265 is reset in response to the power-up signal VCCHB and the selection signal SEL is reset to the logic low level by the reset output terminal NE. Furthermore, the latch circuit 265 sets the output terminal NE in response to the second pulse signal PUL2 and resets the output terminal NE in response to the third pulse signal PUL3. The inverter 271 inverts the signal of the output terminal NE to generate the selection signal SEL.

Figure 6A:
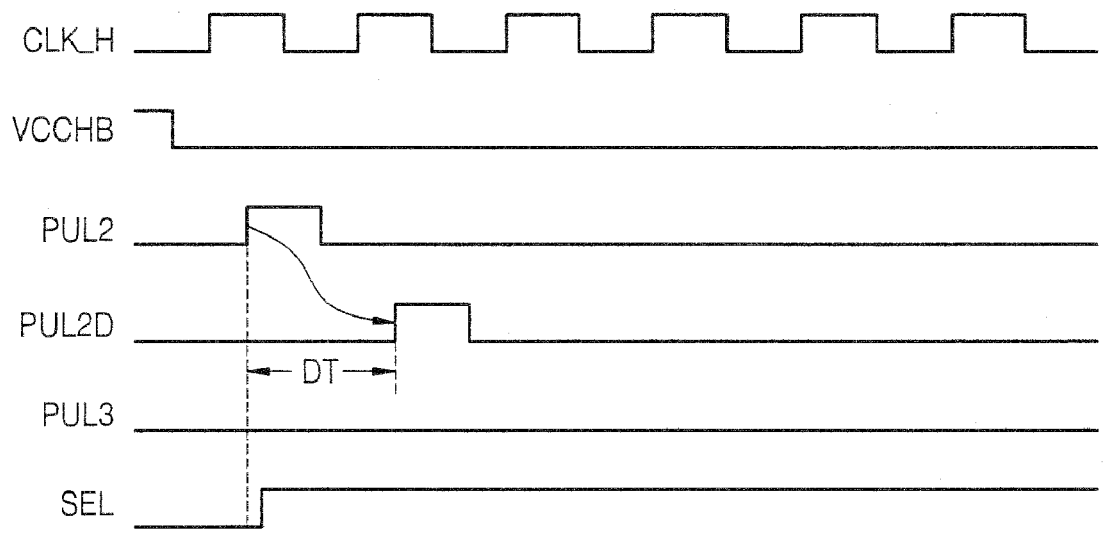
FIG. 6A is a timing diagram explaining the operation of the frequency information generation circuit 260 when the semiconductor device 200 of FIG. 2 operates at a high frequency.

FIG. 6A is a timing diagram explaining the operation of the frequency information generation circuit 260 when the semiconductor device 200 of FIG. 2 operates at the high frequency. The frequency information generation circuit 260 operates as described with reference to FIG. 6A.

When the power-up signal VCCHB is in the logic high level, the selection signal SEL is reset to the logic low level. After the power up signal VCCHB transitions to the low level, the second pulse signal PUL2 is generated with a pulse width substantially the same as that of a high frequency system clock signal CLK_H. The second pulse signal PUL2 is delayed by a delay time DT set by the delay circuit 261 of FIG. 5 to generate the delayed second pulse signal PUL2D. Subsequently, the logical AND operation on the second pulse signal PUL2 and the delayed second pulse signal PUL2D is performed to generate the third pulse signal PUL3. Because the second pulse signal PUL2 and the delayed second pulse signal PUL2D are not high during the same time period, the third pulse signal PUL3 is held in the logic low level. The third pulse signal PUL3 indicates that the semiconductor device (200 of FIG. 2) operates at the high frequency.

The selection signal SEL is activated to the logic high level by the second pulse signal PUL2. It is then held in the logic high level. The selection signal SEL is provided to the output data sense amplifier included in the control circuit 280 of FIG. 2 such that the semiconductor device (200 of FIG. 2) operates at the high frequency.

Figure 6B:
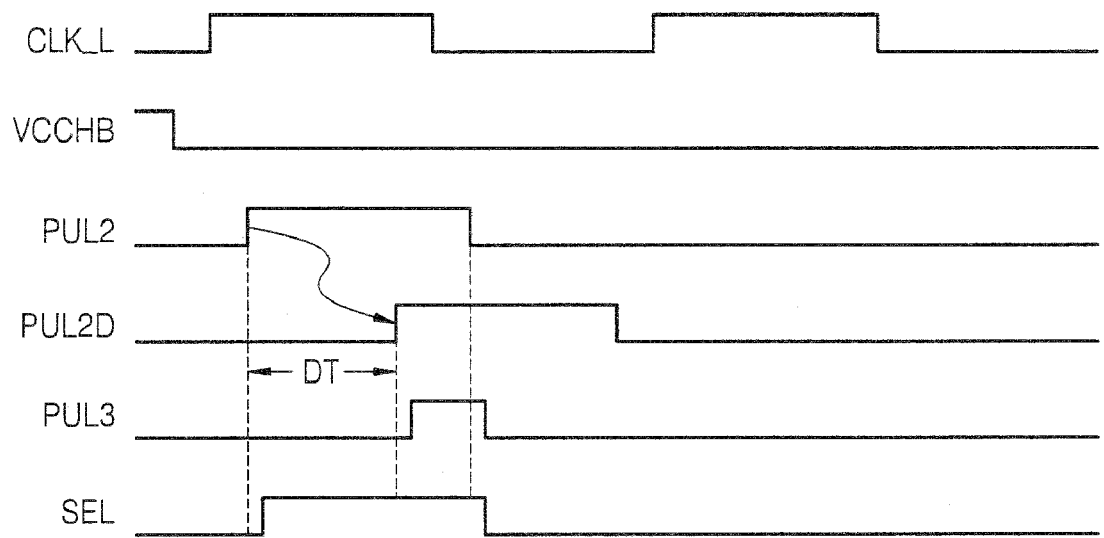
FIG. 6B is a timing diagram explaining the operation of the frequency information generation circuit 260 when the semiconductor device 200 of FIG. 2 operates at a low frequency.

FIG. 6B is a timing diagram explaining the operation of the frequency information generation circuit 260 when the semiconductor device 200 of FIG. 2 operates in the low frequency. The frequency information generation circuit 260 operates as described with reference to FIG. 6B.

When the power-up signal VCCHB is in the logic high level, the selection signal SEL is reset to the logic low level. After the power-up signal VCCHB transitions to a logic low level, the second pulse signal PUL2 is generated, with a pulse width substantially the same as that of a low frequency system clock signal CLK_L. The second pulse signal PUL2 is delayed by a delay time DT to generate the delayed second pulse signal PUL2D. Subsequently, the logical AND operation on the second pulse signal PUL2 and the delayed second pulse signal PUL2D is performed to generate the third pulse signal PUL3. As a result, the third pulse signal PUL3 is held in the logic high level for a predetermined time. The third pulse signal PUL3 indicates that the semiconductor device (200 of FIG. 2) operates at the low frequency.

The selection signal SEL transitions to the logic high level when the second pulse signal PUL2 transitions to the logic high level. The selection signal SEL transitions to the logic low level when the second pulse signal PUL2 transitions to the logic low level. The selection signal SEL is provided to the output data sense amplifier included in the control circuit 280 of FIG. 2 such that the semiconductor device (200 of FIG. 2) operates at the low frequency.

Various changes in form and details may be made to the embodiments described above without departing from the spirit and scope of the invention as defined by the following claims.

What is claimed is:

1. A control selection circuit for a semiconductor device comprising:
   a pulse generation circuit to delay a first pulse signal by a predetermined delay time to generate a second pulse signal;
   a frequency information generation circuit to generate a selection signal in response to the second pulse signal, the selection signal indicating an operating frequency of the semiconductor device; and
   a control circuit to select a control scheme of for the semiconductor device in response to the selection signal.

2. The control selection circuit according to claim 1, wherein the pulse generation circuit is configured to reset in response to a change in the operating frequency of the semiconductor device.

3. The control selection circuit according to claim 1, wherein the pulse generation circuit is configured to reset in response to a power-up signal.

4. The control selection circuit according to claim 1, wherein the pulse generation circuit comprises:
   a reset unit to reset the second pulse signal to a first logic level in response to at least one of a reset signal and a power-up signal;
   an input unit to delay the first pulse signal by the predetermined delay time;
   an output unit to invert the delayed first pulse signal;
   an output control unit to enable the output unit in response to the at least one of the reset signal and the power-up signal and to disable the output unit in response to the second pulse signal; and
   an output latch unit to generate the second pulse signal by latching an output signal of the output unit.

5. The control selection circuit according to claim 4, wherein the output control unit is configured to enable the output unit in response to logically manipulating the reset signal and the power-up signal.

6. The control selection circuit according to claim 4, wherein the output control unit comprises:

a delay unit to delay the second pulse signal by a second predetermined delay time; and a control latch unit to latch the output signal of the output control unit.

7. The control selection circuit according to claim 6, wherein the delay unit comprises a plurality of serially connected buffers.

8. The control selection circuit according to claim 6, wherein at least one of the output latch unit and the control latch unit comprises cross-coupled inverters.

9. The control selection circuit according to claim 4, wherein the reset unit comprises a logic gate to logically manipulate the reset signal and the power-up signal.

10. The control selection circuit according to claim 4, wherein the input unit comprises a plurality of serially coupled inverters.

11. The control selection circuit according to claim 1, wherein the frequency information generation circuit comprises:

a delay circuit to delay the second pulse signal by a second predetermined delay time to generate a delayed second pulse signal; and an AND gate to logically manipulate the second pulse signal and the delayed second pulse signal to generate a third pulse signal.

12. The control selection circuit according to claim 11, wherein the delay circuit comprises an inverter chain.

13. The control selection circuit according to claim 11, wherein the delay time of the second pulse signal is an integral multiple of a period of the system clock signal.

14. The control selection circuit according to claim 11, wherein the frequency information generation circuit further comprises:

a latch circuit to set a signal on an output terminal in response to the second pulse signal and to reset the output terminal in response to the third pulse signal; and an inverter to invert the signal on the output terminal of the latch circuit to generate the selection signal.

15. The control selection circuit according to claim 14, wherein the latch circuit is configured to reset the signal on the output terminal in response to the power-up signal.

16. The control selection circuit according to claim 15, wherein the latch circuit is a NOR type SR latch.

17. The control selection circuit according to claim 1, wherein the first pulse signal has a pulse width substantially the same as that of a system clock signal.

18. A control selection circuit for a semiconductor device comprising:

a pulse generation circuit to delay a first pulse signal by a predetermined delay time to generate a second pulse signal, and to reset, in response to at least one of a reset signal and a power-up signal, the first pulse signal and having a pulse width substantially the same as that of a system clock signal;

a frequency information generation circuit to generate a selection signal in response to the second pulse signal, and to reset in response to the power-up signal, the selection signal indicating an operating frequency of the semiconductor device; and a control circuit to select a control scheme for the semiconductor device in response to the selection signal.

19. A control selection method for a semiconductor device comprising:

delaying a first pulse signal by a predetermined delay time to generate a second pulse signal;

generating a selection signal in response to the second pulse signal, the selection signal indicating an operating frequency of the semiconductor device; and selecting a control scheme for a semiconductor device in response to the selection signal.

20. The control selection method according to claim 19, further comprising resetting the second pulse signal in response to changing an operating frequency of the semiconductor device.

21. The control selection method according to claim 19, wherein delaying a first pulse signal further comprises generating the second pulse signal in response a power-up signal.

22. The control selection method according to claim 19, wherein generating the selection signal further comprises:

delaying the second pulse signal by a second predetermined delay time to generate a delayed second pulse signal; and performing a logical AND operation on the second pulse signal and the delayed second pulse signal to generate a third pulse signal.

23. The control selection method according to claim 22, wherein delaying the second pulse signal further comprises delaying the second pulse signal by an integral multiple of a period of the system clock signal.

24. The control selection method according to claim 19, wherein generating the selection signal further comprises:

setting a signal on an output terminal of a latch circuit in response to the second pulse signal;

generating a third pulse signal in response to the second pulse signal;

resetting the signal on the output terminal of the latch circuit in response to the third pulse signal; and inverting a signal on the output terminal of the latch circuit to generate the selection signal.

25. The control selection method according to claim 24, wherein resetting the signal on the output terminal of the latch circuit further comprises resetting the signal on the output terminal of the latch circuit in response to a power-up signal.

* * * * *